US011829893B2

(12) United States Patent
 Su

(10) Patent No.: US 11,829,893 B2
(45) Date of Patent: Nov. 28, 2023

(54) ANALYSIS METHOD FOR SEMICONDUCTOR DEVICE

(71) Applicant: Shanghai Huali Integrated Circuit Mfg. Co., Ltd., Shanghai (CN)

(72) Inventor: Ping-Hsun Su, Shanghai (CN)

(73) Assignee: Shanghai Huali Integrated Circuit Mfg. Co., Ltd., Shanghai (CN)

( * ) Notice: Subject to any disclaimer, the term of this patent is extended or adjusted under 35 U.S.C. 154(b) by 590 days.

(21) Appl. No.: 16/828,990

(22) Filed: Mar. 25, 2020

(65) Prior Publication Data

US 2020/0311578 A1 Oct. 1, 2020

(51) Int. Cl.
| | |
|---|---|
| *G06F 30/39* | (2020.01) |
| *G06N 5/04* | (2023.01) |
| *G06N 20/00* | (2019.01) |
| *G06N 5/02* | (2023.01) |
| *G01R 31/26* | (2020.01) |
| *G06F 30/367* | (2020.01) |

(52) U.S. Cl.
CPC ............ *G06N 5/04* (2013.01); *G01R 31/2621* (2013.01); *G06F 30/367* (2020.01); *G06F 30/39* (2020.01); *G06N 5/02* (2013.01); *G06N 20/00* (2019.01)

(58) Field of Classification Search
CPC .......... G06N 5/04; G06N 20/00; G06N 5/022; G06N 5/046; G06N 5/02; G06F 30/367; G06F 30/39; G01R 31/2621
See application file for complete search history.

(56) References Cited

U.S. PATENT DOCUMENTS

| 6,210,983 B1 * | 4/2001 | Atchison ................. H01L 22/20 |
| | | 700/121 |
| 6,802,045 B1 * | 10/2004 | Sonderman ............. H01L 22/20 |
| | | 703/22 |

(Continued)

OTHER PUBLICATIONS

P. H. Wu, M. P. Lin, T. Y. Ho, "Analog Layout Synthesis with Knowledge Mining" pp. 1-4, IEEE (Year: 2015).*

(Continued)

*Primary Examiner* — Kibrom K Gebresilassie
(74) *Attorney, Agent, or Firm* — Quarles & Brady LLP

(57) ABSTRACT

The present invention provides an analysis method for a semiconductor device for analyzing a plurality of electrical parameters of a HKMG fin field effect transistor and a plurality of process parameters for manufacturing the transistor, comprising: performing key process parameter correlation analysis for each electrical parameter, wherein the key process parameter correlation analysis comprises: constructing multiple electrical-process models of the electrical parameter corresponding to each process parameter respectively; performing sensitivity analysis for each of the electrical-process models; determining a plurality of key process parameters from the plurality of process parameters based on the obtained sensitivity analysis results of the electrical-process models; and determining a relationship between the electrical parameter and the plurality of key process parameters based on a knowledge database. According to the analysis method provided by the present invention, the process variation which truly causes the transistor's electrical characteristics to change is excavated through the expert system.

18 Claims, 8 Drawing Sheets

(56) References Cited

U.S. PATENT DOCUMENTS

| | | | | |
|---|---|---|---|---|
| 7,831,307 B1* | 11/2010 | Moffitt | | A61N 1/36185 607/46 |
| 8,423,341 B2* | 4/2013 | Lu | | G06F 30/367 703/2 |
| 9,679,094 B2* | 6/2017 | Lu | | G06F 30/36 |
| 2003/0229410 A1* | 12/2003 | Smith | | H01L 21/3212 700/109 |
| 2004/0143403 A1* | 7/2004 | Brandon | | G16B 25/10 702/19 |
| 2006/0100873 A1* | 5/2006 | Bittner | | G06F 30/367 704/256.2 |
| 2008/0133202 A1* | 6/2008 | Tseng | | G06F 30/367 703/14 |
| 2008/0275585 A1* | 11/2008 | Lin | | G05B 23/0221 700/109 |
| 2008/0275586 A1* | 11/2008 | Ko | | G05B 23/0221 700/109 |
| 2009/0222400 A1* | 9/2009 | Kupershmidt | | G06F 16/2246 706/53 |
| 2011/0066997 A1* | 3/2011 | O'Riordan | | G06F 30/3323 716/139 |
| 2011/0253999 A1* | 10/2011 | Chatterjee | | G01R 31/2884 257/E23.179 |
| 2012/0239178 A1* | 9/2012 | Wu | | H01L 22/14 700/104 |
| 2013/0132925 A1* | 5/2013 | Johnson | | G06F 30/30 716/136 |
| 2014/0369006 A1* | 12/2014 | Williams | | H05K 7/2089 29/832 |
| 2016/0300004 A1* | 10/2016 | Barker | | G06F 30/36 |
| 2016/0321391 A1* | 11/2016 | Lu | | G06F 30/36 |
| 2018/0349538 A1* | 12/2018 | Bhosale | | G06F 30/398 |

OTHER PUBLICATIONS

P. Wu, M.P. Lin, T. H. Ho, "Analog Layout Synthesis with Knowledge Mining", pp. 1-4, IEEE (Year: 2015).*

* cited by examiner

ANALYSIS METHOD FOR SEMICONDUCTOR DEVICE

CROSS REFERENCE TO THE RELATED APPLICATION

This application is based upon and claims priority to Chinese Patent Application No. 201910252299.2, filed on Mar. 29, 2019, the entire content of which is incorporated herein by reference.

FIELD

The present invention relates to the field of semiconductors, and more particularly to the analysis and optimization of on-line process parameters for the manufacture of semiconductor devices.

BACKGROUND

The introduction of FinFET (Fin-Field Effect Transistor) is a major advancement in the semiconductor industry of the 16 nm technology generation. Although the 16-nm high dielectric material metal gate fin field effect transistor (HKMG FinFET, High-K Metal Gate FinFET) is being introduced into mass production, there is still much room for improvement in process optimization, for example, variations in transistor electrical characteristics caused by process variations, and the effects of process variations on components and circuits caused by the latest 3D structures and new processes in the manufacturer.

Although, in terms of theoretical research, there are already related literatures discussing the optimization of the above process, most of the existing related literatures use computer simulation to simulate the variation of process and component electrical characteristics. Moreover, only a few known process steps have been discussed, and all process steps have not been integrated into a comprehensive analysis, the interaction effects of the processes and the interaction between processes and transistor's electrical characteristics have not been studied. Therefore, there is no corresponding solution for optimizing the process.

Therefore, it is desirable to provide an analysis method that can analyze the interaction between process and transistor's electrical characteristics through expert system by means of the processing power of big data analysis, so as to find the source of process variation that truly causes the electrical characteristics of transistor to be changed, and thus provide a possibility for subsequent optimization of the process.

SUMMARY

A brief summary on one or more aspects is given below to provide the basic understanding for these aspects. This summary is not an exhaustive overview of all the contemplated aspects and is neither intended to indicate critical or decisive elements of all aspects nor to attempt to define the scope of any or all aspects. Its sole purpose is to present some concepts of one or more aspects in a simplified form as a preface for a more detailed description presented later.

In order to make up for the fact that there is no theoretical and practical operation in the industry to analyze the interaction between the processes and electrical characteristics of the HKMG FinFET device, there is no way to find the actual source of process variation, that causes the electrical characteristics of the transistor to be changed, the present invention provides an analysis method for a semiconductor device for analyzing a plurality of electrical parameters of a HKMG Fin-FET and a plurality of process parameters for manufacturing the transistor, wherein the analysis method comprises: performing key process parameter correlation analysis for each electrical parameter, wherein the key process parameter correlation analysis comprises:
  respectively constructing a plurality of electrical-process models of the electrical parameter corresponding to each process parameter;
  performing sensitivity analysis for each of the electrical-process models;
  determining a plurality of key process parameters from the plurality of process parameters based on the obtained sensitivity analysis results of the electrical-process models; and
  determining a relationship between the electrical parameter and the plurality of key process parameters based on a knowledge database.

In an embodiment of the foregoing analysis method, the relationship between the electrical parameter and the plurality of key process parameters comprises correlations and empirical formulas between the electrical parameter and the plurality of key process parameters.

In an embodiment of the foregoing analysis method, the knowledge database is pre-set with a plurality of association rules of electrical parameters and key process parameters, and is updated by self-learning of the association rules.

In an embodiment of the foregoing analysis method, the sensitivity analysis for each of the electrical-process models further comprises:
  calculating a covariance of each of the electrical-process models; and
  calculating a correlation coefficient for each of the electrical-process models based on the covariance of the electrical-process model.

In an embodiment of the foregoing analysis method, determining a plurality of key process parameters for each electrical parameter further comprises:
  sorting correlation coefficients of a plurality of the electrical-process models by absolute values;
  the plurality of key process parameters are process parameters corresponding to a predetermined number of electrical-process models having the highest absolute values of the correlation coefficients.

In an embodiment of the foregoing analysis method, the correlation coefficient is a Pearson correlation coefficient.

In an embodiment of the foregoing analysis method, the key process parameter correlation analysis further comprises:
  obtaining a plurality of specific values for each of the process parameters; and
  obtaining a plurality of specific values for each of the electrical parameters.

In an embodiment of the foregoing analysis method, the analysis method further comprises:
  performing electrical parameter inline analysis on the plurality of electrical parameters, wherein the electrical parameter inline analysis comprises:
  constructing a plurality of electrical parameter models by grouping the plurality of electrical parameters in pairs;
  performing sensitivity analysis on each of the electrical parameter models;
  extracting a plurality of key electrical parameter models from the plurality of electrical parameter models based on sensitivity analysis results of the electrical parameter models; and performing data mining on the plurality of key electrical parameter models to determine correlations among a plurality of key electrical parameters of the plurality of electrical parameters.

In an embodiment of the foregoing analysis method, the plurality of key electrical parameters and correlations there between and correlations between each of the key electrical parameters and its corresponding key process parameters are analyzed to determine the relationship between the plurality of key electrical parameters and the plurality of key process parameters.

In an embodiment of the foregoing analysis method, the analysis method further comprises:
 adjusting the key process parameters according to the required key electrical parameters based on the relationship between the plurality of key electrical parameters and the plurality of key process parameters.

In an embodiment of the foregoing analysis method, the sensitivity analysis of the plurality of electrical parameter models further comprises:
 calculating a covariance of each of the electrical parameter models; and
 calculating a correlation coefficient of each of the electrical parameter models based on the covariance of the electrical parameter model.

In an embodiment of the foregoing analysis method, extracting the plurality of key electrical parameter models further comprises:
 extracting an electrical parameter model whose absolute value of the correlation coefficient is greater than a preset threshold from the plurality of electrical parameter models as the key electrical parameter model.

In an embodiment of the foregoing analysis method, performing the data mining further comprises:
 performing the data mining based on correlation coefficients of the plurality of key electrical parameter models to determine correlations between the key electrical parameters.

In an embodiment of the foregoing analysis method, performing the data mining based on the correlation coefficients of the plurality of key electrical parameter models further comprises:
 constructing a correlation coefficient matrix of the plurality of key electrical parameter models by using the correlation coefficients of the plurality of key electrical parameter models as matrix elements; and
 determining the correlations among the key electrical parameters based on the correlation coefficient matrix.

In an embodiment of the foregoing analysis method, determining the correlations among the key electrical parameters based on the correlation coefficient matrix further comprises:
 performing agglomerative hierarchical clustering based on the correlation coefficient matrix.

In an embodiment of the foregoing analysis method, the correlation coefficient is a Pearson correlation coefficient, and the correlation coefficient matrix is a Pearson correlation coefficient matrix.

The present invention also provides a computer apparatus comprising a memory, a processor and a computer program stored on the memory and operable on the processor, wherein the processor executes the computer program to perform the steps of the analysis method according to any one of the foregoing analysis methods.

The present invention also provides a computer readable storage medium having stored there on a computer program, wherein the computer program is executed by a processor to perform the steps of the analysis method according to any one of the foregoing analysis methods.

According to the analysis method provided by the present invention, by performing comprehensive analysis of a plurality of process parameters for manufacturing HKMG fin field effect transistors and electrical parameters of the transistors, key process parameters affecting electrical parameters of the transistors are obtained, and process variation and its source that truly cause the electrical characteristics of transistors to change are excavated, thereby providing the possibility for subsequent adjustment of the process and optimization of the process.

REFERENCE SIGNS a top-fin width
b bottom-fin width
c fin height
θ top-fin corner angle
d gate length
e1 gate-spacer-1 thickness
e2 gate-spacer-2 thickness
f S/D proximity
g S/D depth
h S/D Epi-overgrowth height
lateral S/D SEG wight
j HK/IL thickness
k gate height
HKMG High-K Metal Gate
Spacer spacer
Gate gate
Fin fin
Contact contact

DETAILED DESCRIPTION

The invention is described in detail below with reference to the drawings and specific embodiments. It is to be noted that the aspects described below in conjunction with the drawings and the specific embodiments are merely exemplary and are not to be construed as limiting the scope of the invention.

The following description of the present disclosure is provided to enable any one skilled in the art to make or use the present disclosure. Various modifications to the present disclosure would all be obvious to a person skilled in the art, and the general principles defined herein can be applied to other variations without departing from the spirit or scope of the present disclosure. Thereby, the present disclosure is not intended to be limited to the examples and designs described herein, but should be granted with the widest scope consistent with the principle and novelty features disclosed herein.

In the following detailed description, numerous specific details are set forth to provide a more thorough understanding of the present invention. However, it will be apparent to those skilled in the art that the present invention may be practiced without limitations from these specific details. In other words, well-known structures and devices are shown in a block diagram form and are not shown in detail, so as to avoid obscuring the present invention.

The reader is cautioned as to all files and documents which are filed at the same time as this specification and which are open for the public to consult, and the contents of all such files and documents are incorporated herein by reference. Unless directly stated otherwise, all features disclosed in this specification (including any of the appended claims, the abstract, and the accompanying drawings) may be replaced by alternative features serving the same, equivalent, or similar purposes. Therefore, unless expressly stated otherwise, each of the features disclosed is only one example of a group of equivalent or similar features.

Figure 1:
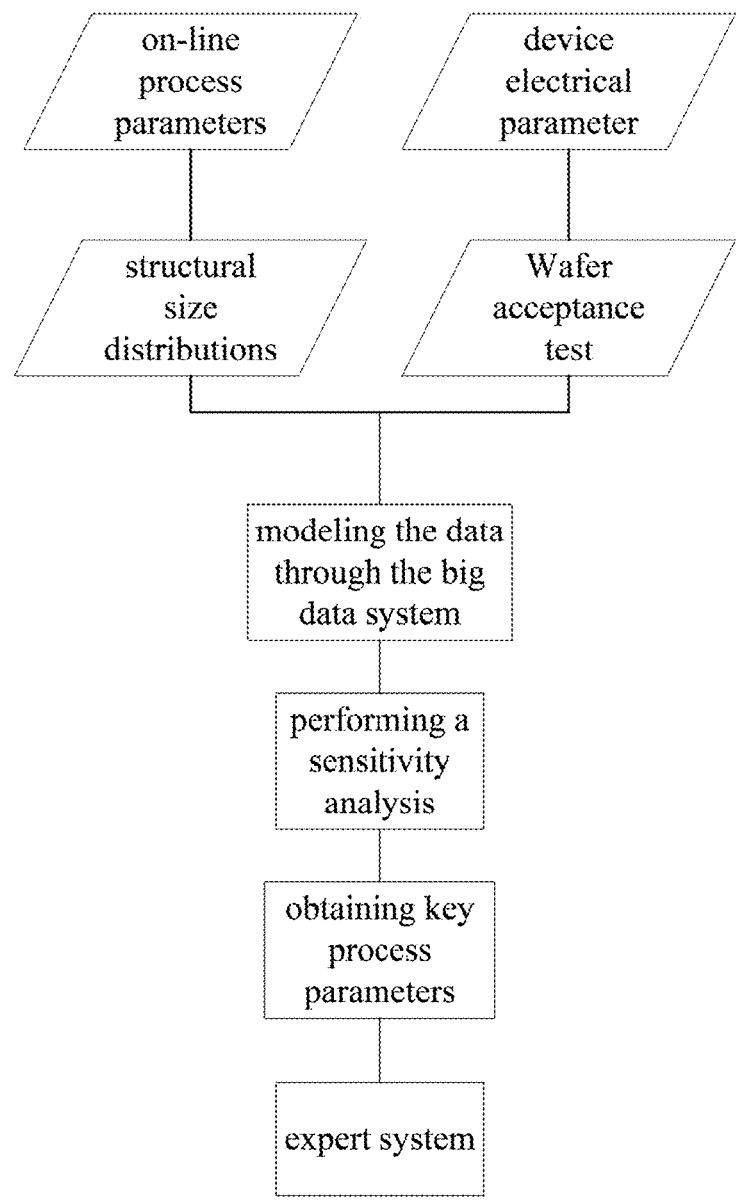
FIG. 1 shows a flow chart of the analysis method provided by the present invention.

As described above, the present invention provides an analysis method of a semiconductor device for analyzing a plurality of electrical parameters of the HKMG fin field effect transistor and a plurality of process parameters for manufacturing the transistor. Please refer to FIG. 1, FIG. 1 shows a flow of an analysis method provided by the present invention. The analysis method provided by the present invention specifically includes, in step 1, first defining on-line process parameters for fabricating a HKMG fin field effect transistor, and obtaining structural size distributions of the HKMG fin field effect transistor corresponding to the on-line process parameters.

In the above step 1, the online process parameters are based on online testing, which is the opposite of offline testing. The wafer in which the semiconductor device is located is tested offline after the manufacturing is completed. After the test, the wafer does not return to the process line to continue the next manufacturing process. After the online test, the wafer needs to continue to the next site for manufacturing. By performing an online test, the structural size distributions of the HKMG fin field effect transistor corresponding to the online process parameters, that is, the specific values corresponding to the online process parameters can be obtained. Moreover, since it is an online test, it can correct errors in time when the process is found to be mutated, thereby avoiding economic losses.

Specifically, in the prior art, the manufacturing process of the fin field effect transistor can be generally divided into at least the following eight steps:
1. Fin formation
2. Dummy gate formation
3. S/D implantation
4. S/D EPI growth
5. Gate replacement
6. Hi-K Metal Gate formation
7. S/D Contact formation
8. BEOL Correspondingly, the process parameters selected in the process step may specifically include at least:
1. Top-Fin Width a
2. Bottom-Fin Width b
3. Fin Height c
4. Top-Fin Corner Angle θ
5. Gate length d
6. Gate-Spacer-1 Thickness e1
7. Gate-Spacer-2 Thickness e2
8. S/D Proximity f
9. S/D Depth g
10. S/D Epi-Overgrowth Height h
11. Lateral S/D SEG Wight i
12. HK/IL Thickness j
13. Gate Height k The parameters 1-4 correspond to the Fin formation step. Parameters 5-7 correspond to the steps of forming a dummy gate, S/D implantation, S/D EPI growth, and the gate replacement. Parameters 8-11 correspond to the steps of S/D implantation and S/D EPI growth. Parameters 12-13 correspond to the step of forming a high-k metal gate.

Figure 2A:
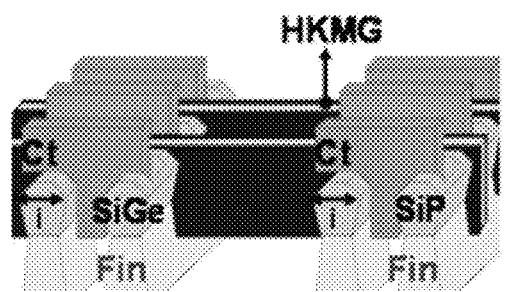
FIG. 2A is a schematic view showing the structure of a fin field effect transistor analyzed by the present invention.
Figure 2B:
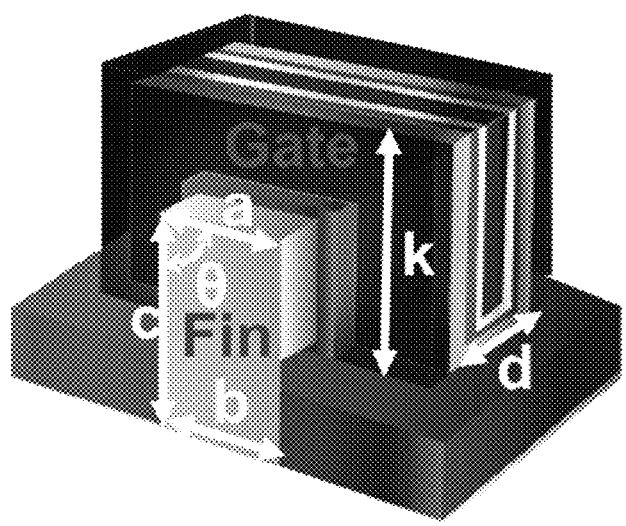
FIG. 2B is a schematic view showing the structure of a fin field effect transistor analyzed by the present invention.
Figure 2C:
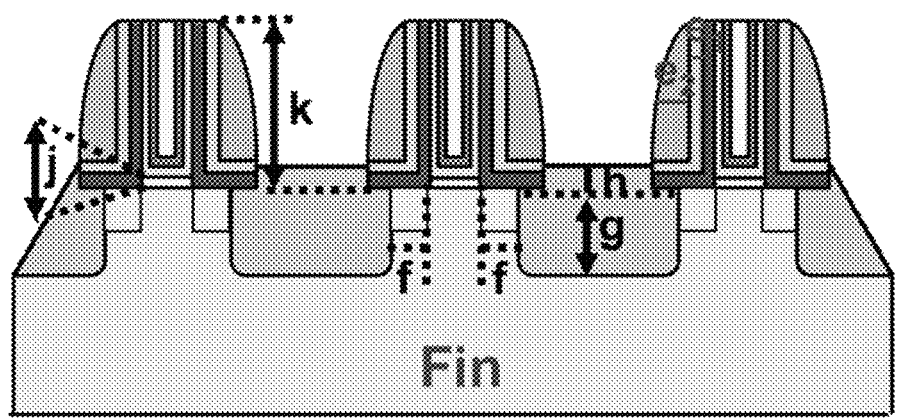
FIG. 2C is a schematic view showing the structure of a fin field effect transistor analyzed by the present invention.

Please refer to the different aspects of the fin field effect transistor structure shown in FIGS. 2A-2B to understand the specifics of the above process parameters. By obtaining and collecting the above data of HKMG FinFET, it provides a basis for subsequent analysis to find the source of process variation that affects the electrical characteristics of the transistor.

Step 1 further includes defining a device electrical parameter of the HKMG fin field effect transistor, and obtaining a specific value of the electrical parameter by a Wafer acceptance test (WAT). Wafer acceptance test is in a special position in the semiconductor production enterprise's processing line. Off-line WAT testing is performed after all processing steps are performed, and all wafers must undergo WAT testing to determine if the wafer meets the expected specifications. The data tested by WAT has many engineering applications, including: testing process window, testing design rules, controlling process parameters, debugging the process, characterizing reliability, modeling the device design and developing next-generation products and more.

Typically, off-line WAT tests wafers after the wafer has completed the manufacturing process. With the development of technology, some products have a very long manufacturing cycle of up to three months. In this case, if there is a problem with the process at the previous station, the problem is discovered when the WAT is reached, which affects a large number of products and causes significant losses to the manufacturing company. Therefore, it is necessary to find out problems as early as possible.

In order to solve the above problem, an online WAT test can also be used. In one embodiment, the WAT system used in the present invention is configured in an online WAT.

Further, the test parameters of the WAT are divided into two categories, one is related to the device, including the turn-on voltage, the saturation current, the turn-off current, the puncture voltage, and the like of the MOS transistor. The other type is structure related, including sheet resistance, contact resistance, gate oxide thickness, isolation, and the like.

In the present invention, the test parameters of the WAT are more focused on the above-described turn-on voltage, puncture voltage, saturation current, quiescent current, turn-off current, and the like, which are related to the electrical characteristics of the device. After the WAT test, specific values of the device-related electrical characteristic parameters can be obtained.

It should be noted that although the WAT test is introduced by way of example, the relevant parameters of the above electrical characteristics of the device can also be implemented by other existing or future test methods and test means, and are not limited to the above WAT test.

Then, after obtaining and collecting relevant data, step 2 is performed to model the data through the big data system, specifically, for each electrical parameter, to establish electrical-process models between the electrical parameter and the plurality of process parameters.

For example, it is assumed that the analysis object of the present invention includes electrical parameters DCi to DCj, and process parameters ILi to ILj. For the electrical parameter DCi, a plurality of electrical-process models DCi-ILi to DCi-ILj are respectively established corresponding to process parameters ILi to ILj.

After the data are modeled, it's step 3 to perform a sensitivity analysis on the established models. Specifically, the sensitivity analysis further includes calculating a covariance of each electrical-process parameter model, and calculating a correlation coefficient of each electrical-process parameter model based on the covariance.

Specifically, calculating the covariance of each electrical-process parameter model can be calculated by the following formula:

$$\mathrm{cov}(DC_1, IL_1) = \sigma_{DC_1 IL_1} E[(DC_1 - u_1)(IL_1 - u_2)]$$

Wherein E represents the expected value; u1, u2 are the mean values of DC1 and IL1, respectively.

Covariance is used in probability theory and statistics to measure the overall error of two variables. The covariance represents the total error of two variables, which is different from the variance that only represents the error of one variable. If the two variables change in the same trend, that is, if one of them is greater than its own expected value and the other is greater than its own expected value, the covariance between the two variables is a positive value. If the two variables change in opposite directions, that is, one is greater than its own expected value and the other is less than its own expected value, the covariance between the two variables is a negative value.

Intuitively, the covariance represents the expectation of the overall error of the two variables. If the trends of the two variables are the same, that is, if one of them is greater than its own expectation and the other is greater than its own expectation, then the covariance between the two variables is positive; if the two variables change in the opposite direction, that is, if one of the variables is greater than its own expected value and the other is less than its own expected value, the covariance between the two variables is a negative value.

Further, the correlation coefficient of each electrical-process parameter model calculated based on the covariance can be calculated by the following formula:

$$\mathrm{corr}(DC_1, IL_1) = \rho_{DC_1 IL_1} = \frac{\mathrm{cov}(DC_1, IL_1)}{\sqrt{\mathrm{cov}(DC_1)\mathrm{cov}(IL_1)}}$$

wherein:

$$\mathrm{cov}(DC_1) = \mathrm{cov}(DC_1, DC_1) = \sigma_{DC_1 DC_1} = E[(DC_1 - u_1)(DC_1 - u_1)]$$

$$\mathrm{cov}(IL_1) = \mathrm{cov}(IL_1, IL_1) = \sigma_{IL_1 IL_1} = E[(IL_1 - u_2)(IL_1 - u_2)]$$

And E represents the expected value; u1, u2 are the mean values of DC1 and IL1 respectively.

The correlation coefficient is a statistical indicator used to reflect the closeness of the correlation between variables. Due to the different research objects, the correlation coefficient has many definitions. The Pearson correlation coefficient is more commonly used. The embodiments provided by the present invention are also based on the Pearson correlation coefficient. The Pearson correlation coefficient is the first statistical indicator designed by the statistician Carl Pearson. It is the amount of linear correlation between the variables. The Pearson correlation coefficient is calculated by the product-moment method. Based on the dispersion of the two variables and their respective averages, the two dipersions are multiplied to reflect the correlation between the two variables, and the linear single correlation coefficient is studied.

It can be seen from the above calculation method that the Pearson correlation coefficient between DC1 and IL1 is the covariance of DC1 and IL1 divided by the standard deviation of DC1 and the standard deviation of IL1.

Therefore, the correlation coefficient can also be regarded as a covariance, which is a special covariance that eliminates the influence of dimensions of the two variables and has been standardized. Because of being a special covariance, the Pearson correlation coefficient has the following characteristics:

1. It can reflect whether the two variables change in the same direction or in the opposite direction. Positive represents the change is in the same direction, negative represents the change is in the opposite direction.
2. Because it is the covariance after standardization, more importantly, it eliminates the influence of the magnitude of the change of the two variables, but simply reflects the degree of similarity between the two variables per unit change.

In general, when the correlation coefficient of DC1 and IL1 is 1, it shows that the positive similarity of the two variables is the largest, that is, DC1 is doubled and IL1 is doubled, or DC1 is halved and IL1 is halved. That is, it is completely positive correlation (with DC1 and IL1 as the horizontal and vertical axes, a straight line with a positive slope can be drawn, so DC1 and IL1 are linear).

As their correlation coefficient decreases, the similarity between the changings of the two variables decreases. When the correlation coefficient is 0, there is no similarity between the changings of the two variables, that is, the two variables are irrelevant.

When the correlation coefficient continues to decrease, to be less than 0, the two variables begin to have a reverse similarity. As the correlation coefficient continues to decrease, the reverse similarity will gradually become larger.

When the correlation coefficient is −1, the reverse similarity of the two variables is the largest, that is, DC1 is doubled and IL1 is halved, or DC1 is halved and IL1 is doubled. That is, it is completely negatively correlated (using DC1 and IL1 as the horizontal and vertical axes, a straight line with a negative slope can be drawn, so DC1 and IL1 are also linear).

That is to say, the larger the absolute value of the Pearson correlation coefficient (the closer to 1 or −1) is, the stronger the correlation is. Conversely, the closer to 0, the Pearson correlation coefficient is, the weaker the correlation is.

Therefore, after performing the sensitivity analysis, step 4 is performed to obtain key process parameters affecting the electrical parameters from multiple process parameters. Based on the above analysis, extracting multiple electrical-process models whose absolute value of the correlation coefficient is greater than the preset threshold, and the process parameter corresponding to the extracted electrical-process model is the key process parameter.

That is to say, when corr(DCi, ILi) is greater than a preset threshold, it is considered that the corresponding process parameter ILi in DCi-ILi is a key process parameter. Those skilled in the art should know that, through the above analysis, the Pearson correlation coefficient between the two variables is in the range of −1 to 1 interval. Therefore, after the absolute value is taken, the preset threshold is in the range of 0 to 1. A person skilled in the art can set the preset threshold in the range of 0 to 1 according to the actual test requirements, which is not limited by the present invention.

Figure 3A:
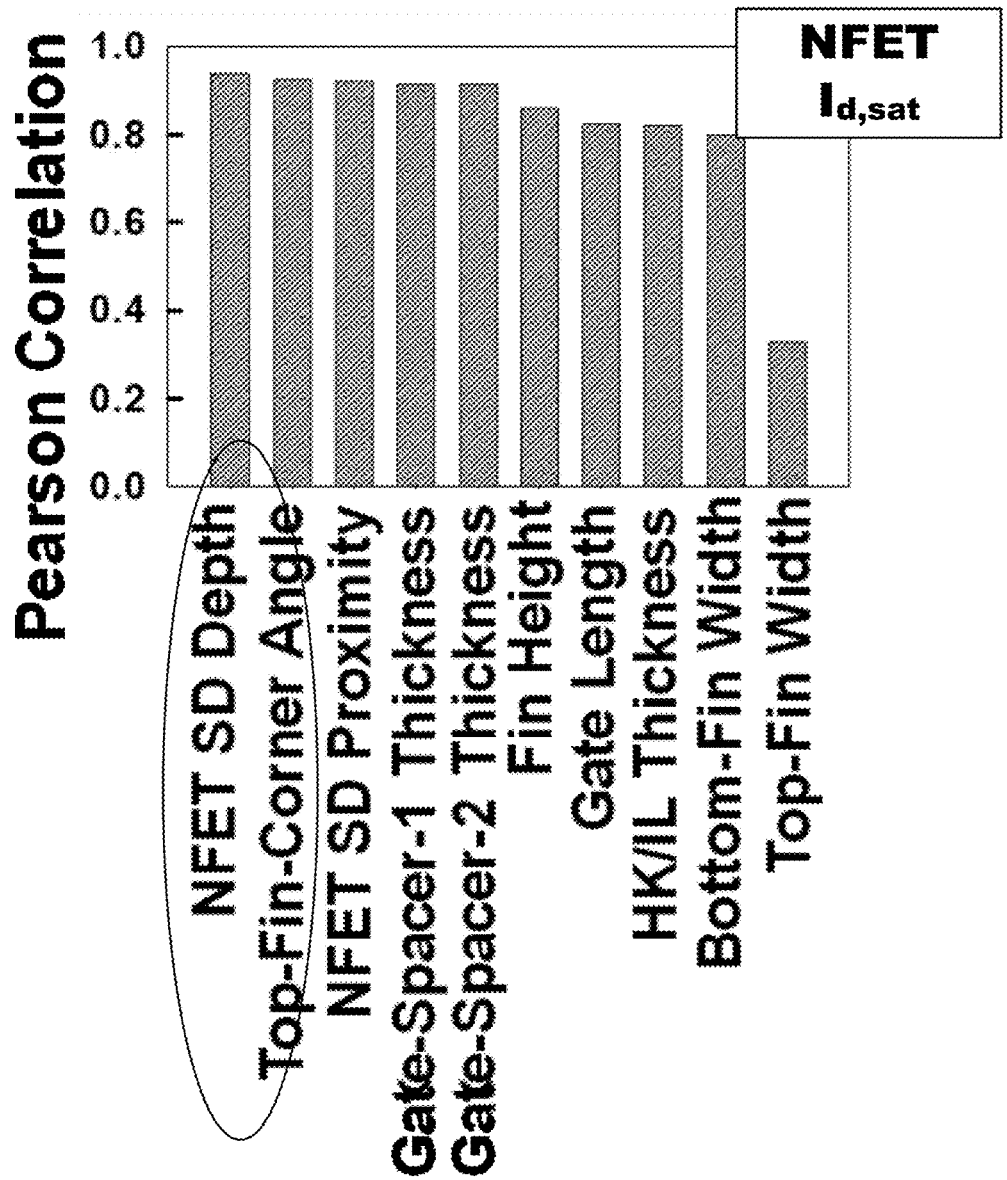
FIG. 3A shows the results of key process parameters affecting the NFET saturation current obtained by the analysis method provided by the present invention.
Figure 3B:
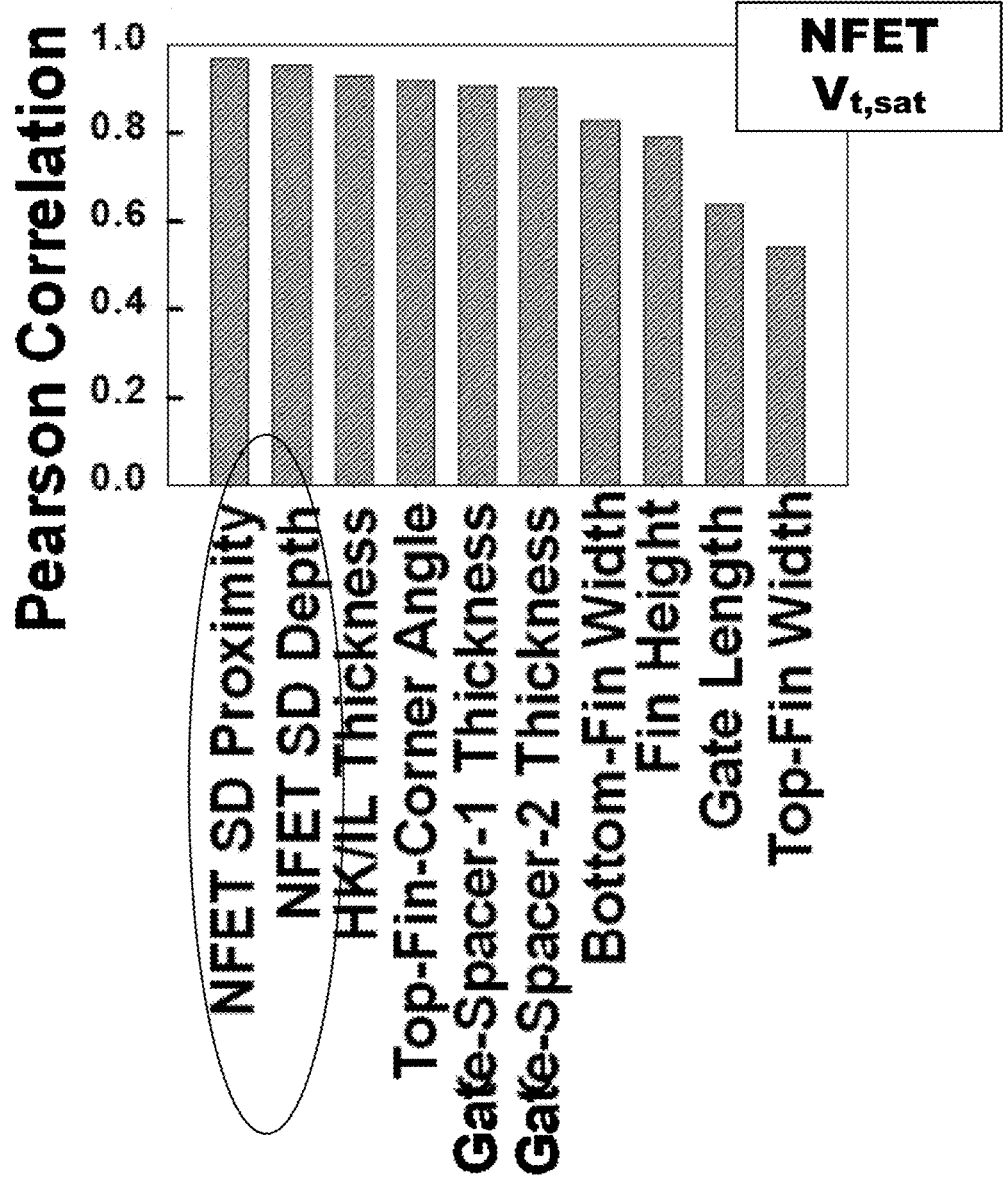
FIG. 3B shows the results of key process parameters affecting the NFET saturation voltage obtained by the analysis method provided by the present invention.
Figure 3C:
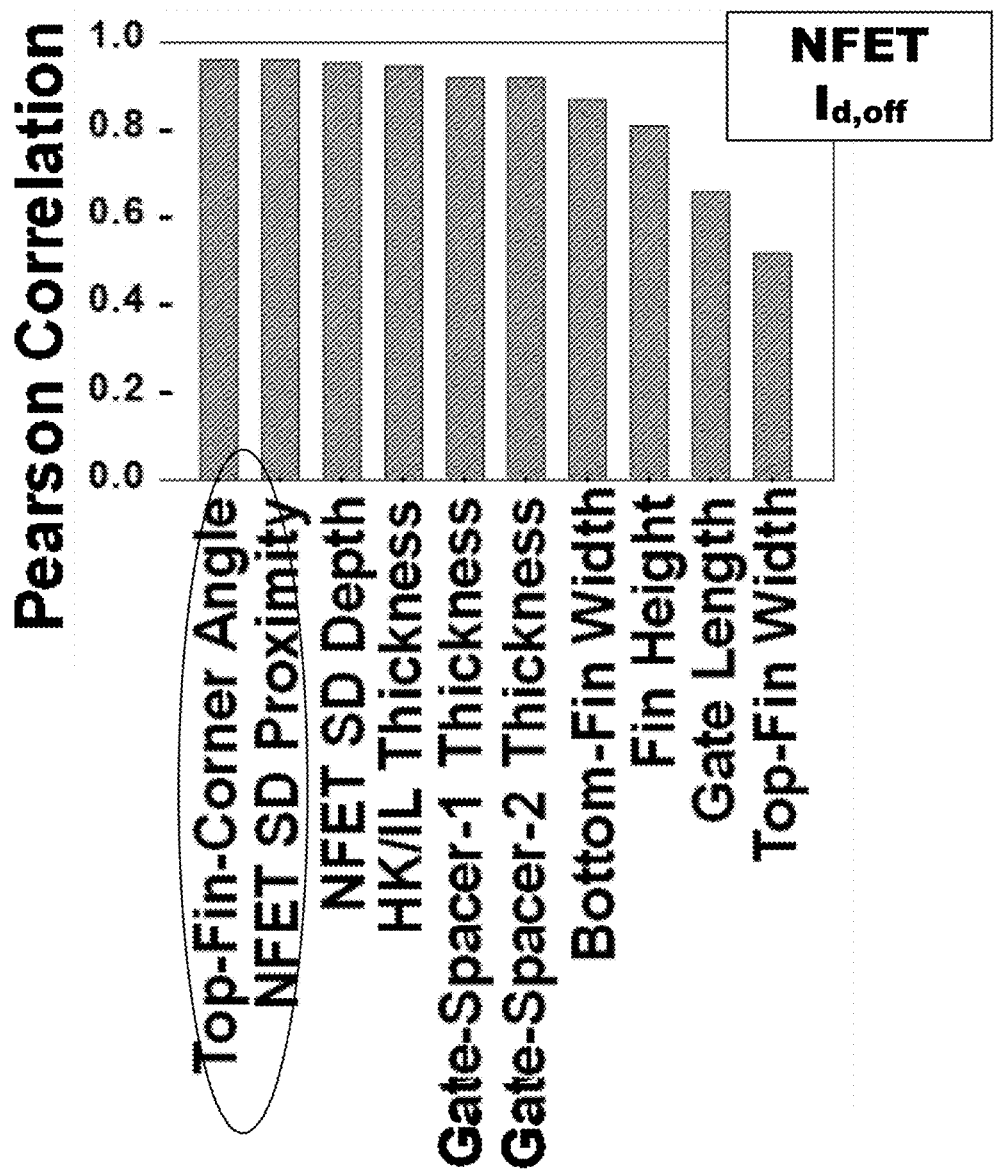
FIG. 3C shows the results of key process parameters affecting the NFET turn-off current obtained by the analysis method provided by the present invention.

Please refer to FIG. 3A-FIG. 3C. FIG. 3A shows the results of several key process parameters for analyzing the saturation current of the NFET. It can be seen that the two most important process parameters that have the greatest influence on the saturation current of the NFET are S/D depth and top-fin corner angle.

FIG. 3B shows the results of several key process parameters for analyzing the saturation voltage of the NFET. It can be seen that the two most important process parameters that have the greatest impact on the saturation voltage of the NFET are S/D proximity and S/D depth.

FIG. 3C shows the results of several key process parameters for analyzing the turn-off current of the NFET. It can be seen that the two most important key process parameters that have the greatest impact on the NFET turn-off current are the top-fin corner angle and S/D proximity.

After the key process parameter have been extracted, step 5 is performed, and the relationship between the above key process parameters and the electrical characteristics of the transistor is further explored based on the knowledge database by the expert system. It is intended to determine the correlation and empirical formula between key process parameters and electrical characteristics.

The expert system is an intelligent computer program system, which contains a large number of expert level knowledge and experience in a certain field, and can use the knowledge and solutions of human experts to deal with the problems in the field. In other words, the expert system is a program system with a large amount of expertise and experience. It uses artificial intelligence technology and computer technology to conduct reasoning and judgment based on the knowledge and experience provided by one or more experts in a certain field to simulate the decision-making process of human experts to solve complex problems that require human experts to deal with. In short, the expert system is a computer program system that simulates human experts to solve problems.

The expert system usually consists of six parts: interaction interface, knowledge base, inference engine, interpreter, comprehensive database, and knowledge acquisition. The knowledge base is used to store the knowledge provided by experts. The problem-solving process of the expert system is to simulate the expert's way of thinking through the knowledge in the knowledge base. In the present invention, the above-mentioned knowledge database is pre-set with a plurality of association rules of electrical parameters and key process parameters, and is updated by self-learning of the association rules.

Therefore, with the help of the expert system and its knowledge database, the correlation and empirical formula between the electrical parameters and the key process parameters can be obtained, which provides the possibility to adjust the key process parameters to obtain better device performance.

In one embodiment, since the transistor has a plurality of electrical parameters, the analysis method provided by the present invention further includes: performing electrical parameter inline analysis on the plurality of electrical parameters, wherein the electrical parameter inline analysis comprises: constructing a plurality of electrical parameter models by grouping the plurality of electrical parameters in pairs; performing sensitivity analysis on each of the electrical parameter models; extracting a plurality of key electrical parameter models from the plurality of electrical parameter models and determining a plurality of key electrical parameters based on sensitivity analysis results of the electrical parameter models; and performing data mining on the plurality of key electrical parameter models to determine correlations among the plurality of key electrical parameters.

And, for the process parameters, there are also inline relationships between the plurality of process parameters, and the analysis method provided by the present invention further includes: constructing a plurality of process parameter models by grouping the plurality of process parameters in pairs; performing sensitivity analysis on each of the process parameter models; extracting a plurality of key process parameter models from the plurality of process parameter models and determining a plurality of key process parameters based on the results of the sensitivity analysis; and performing data mining on the plurality of key process parameter models to determine correlations among the plurality of key process parameters.

With above in mind, the relationship between key electrical parameters and multiple key process parameters can be determined based on the expert database by means of a knowledge database according to the multiple key electrical parameters and correlations there between, each key electrical parameter and its corresponding multiple key process parameters, and the association of multiple key process parameters.

Figure 4:
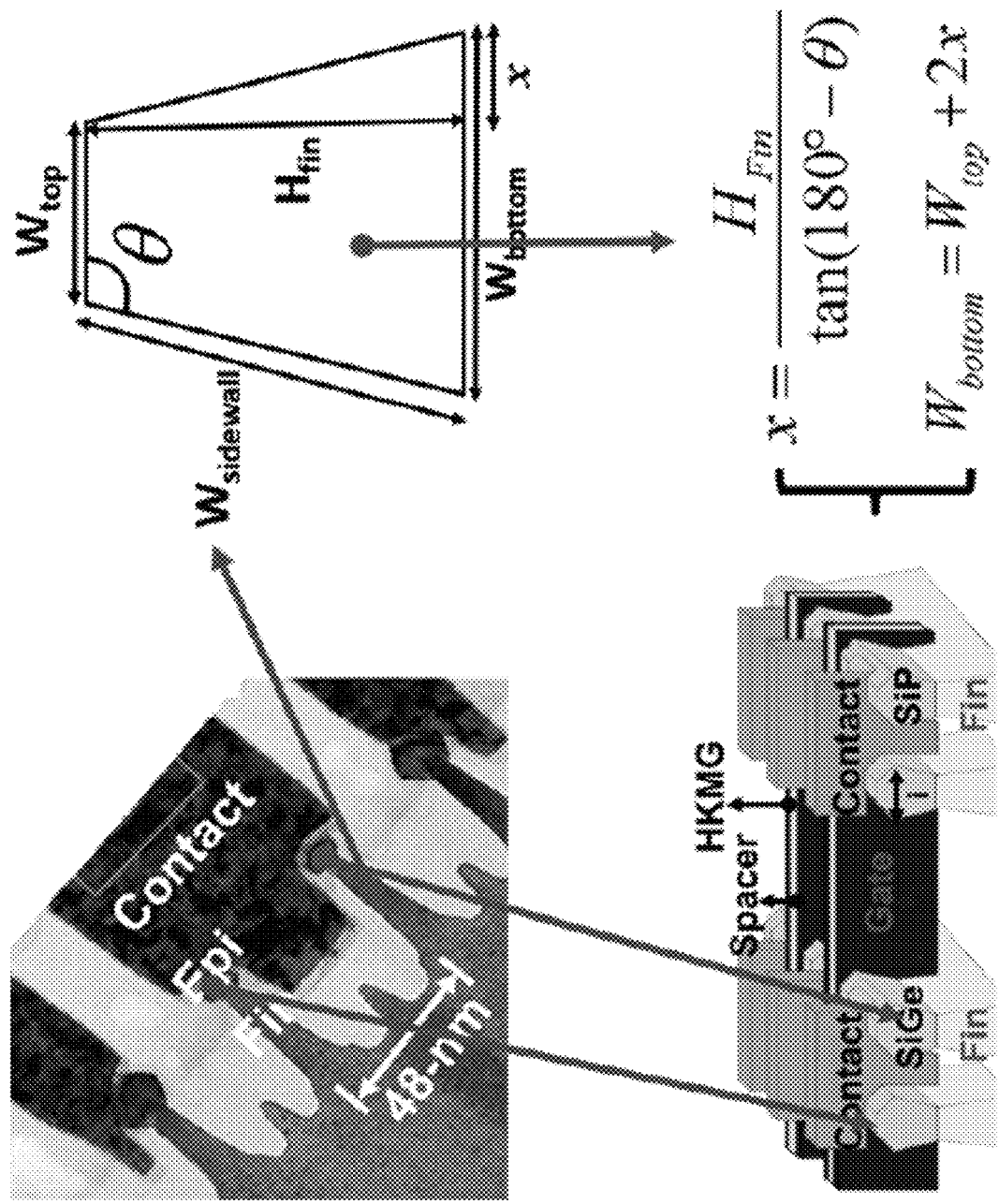
FIG. 4 is a schematic diagram showing the relationship between key process parameters determined based on a knowledge database by the analysis method according to the present invention.

Please refer to FIG. 4, which illustrates an embodiment of an association rule that has been stored in a knowledge database. Specifically, as can be seen from FIG. 3A, after the sensitivity analysis, it is known that $I_{d,\,sat}$ is highest associated with the S/D depth of the NFET, but how is it related? In an embodiment, it is analyzed that the key process parameter S/D depth is related to the gate-spacer-1 thickness and the gate-spacer-2 thickness. It can be considered that the gate-spacer-1 thickness and the gate-spacer-2 thickness are the causes of changes in S/D depth. In the above embodiment, it is further analyzed that the source of changing in the gate-spacer-1 thickness and the gate-spacer-2 thickness are the fin height and the bottom fin width. With above in mind, the formulas that affect the saturation current change can be inferred according to different TEM section formulas preset in the database, as follows:

$$I_{d,sat} = W_{gate}/L_{gate} * e_{ox} * m_n / t_{ox} * (V_{gs} - V_{t,sat})^2$$

Wherein $L_{gate}$ is the effective gate length;
$W_{gate} = 2 * (((W_{bottom\text{-}fin} - W_{top\text{-}fin}/2)^{1/2} + H_{fin}^2)^{1/2} + W_{top\text{-}fin};$
$W_{gate}$ is the effective gate width associated with the bottom fin width ($W_{bottom\text{-}fin}$), top fin width ($W_{top\text{-}fin}$), and fin height ($H_{fin}$);
Electron mobility $m_n$ is empirically affected by S/D proximity, S/D depth, lateral S/D growth, and S/D overgrowth.

Although it is known that there is a correlation between the above parameters, by empirically formulating these parameters, it is possible to better see the relationship between different parameters and the trend of change, and know how to adjust the parameters as needed and the amplitude of the parameters to adjust, thereby facilitate the optimization of subsequent parameter schemes.

FIGS. 5A, 5B, 6A, and 6B respectively verify an aspect of the above analysis results.

Figure 5A:
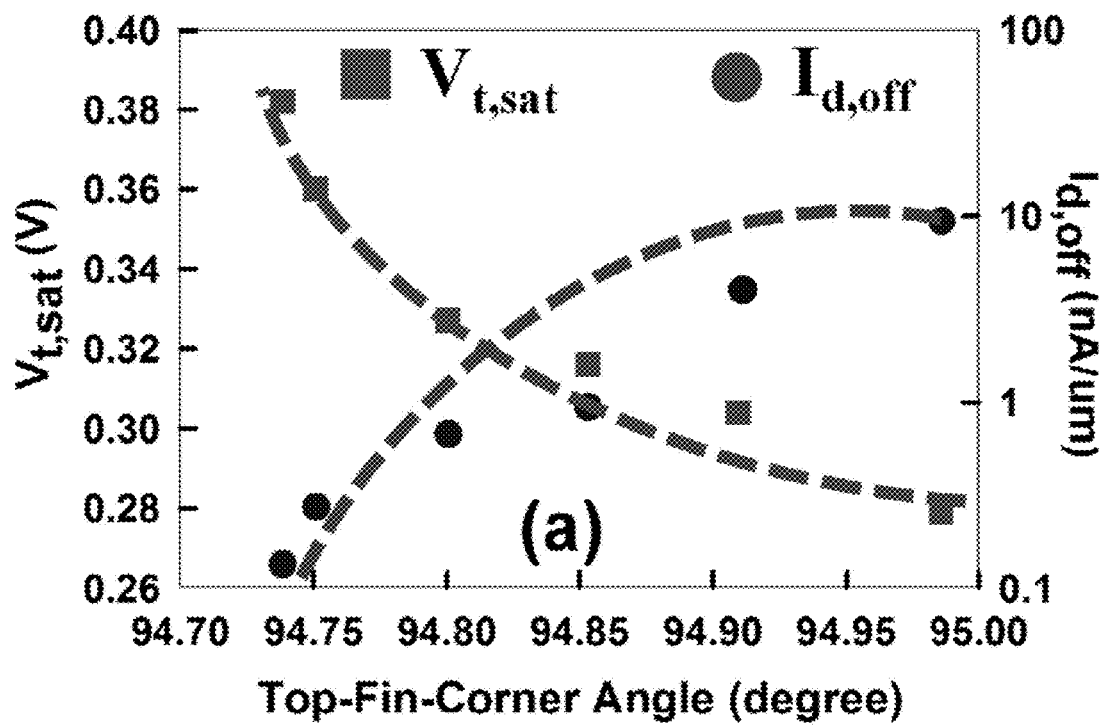
FIG. 5A verifies an aspect of the analytical results provided by the present invention.

As can be seen from FIG. 5A, there is a correlation between the saturation voltage $V_{t, sat}$ and the turn-off current $I_{d, off}$, and the top-fin corner angle. Specifically, the top-fin corner angle is increased to cause the dopants on the top surface of the top fin to drop, so that $I_{d, off}$ rises, and $V_{t, sat}$ decreases.

Figure 5B:
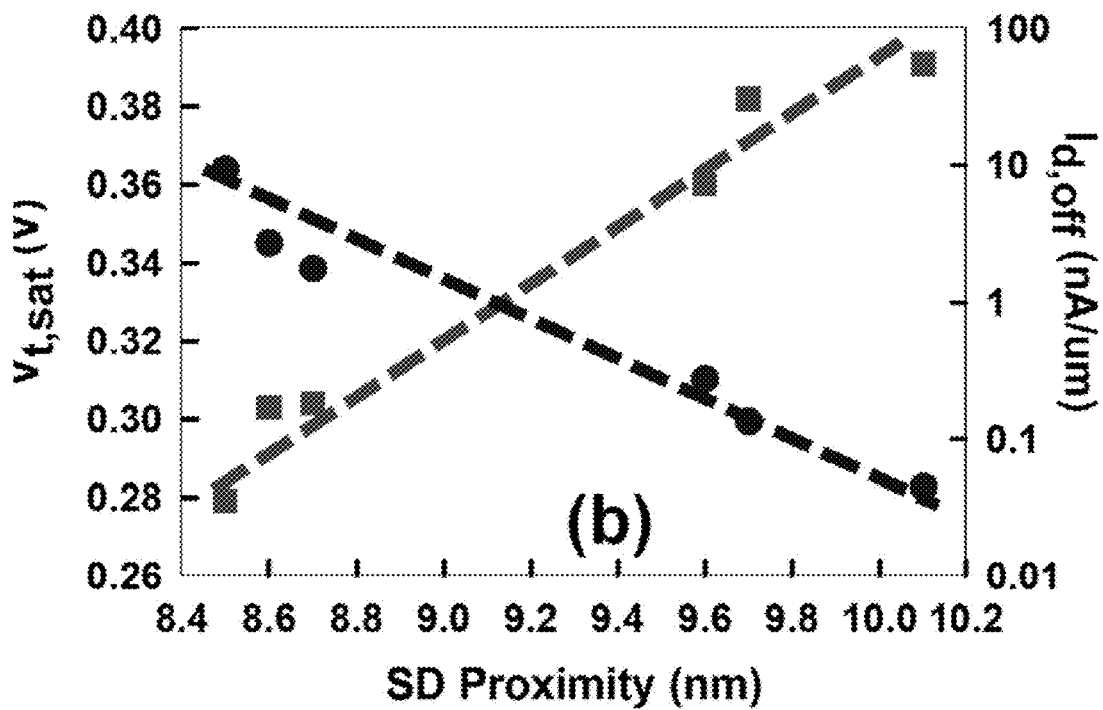
FIG. 5B verifies an aspect of the analysis results provided by the present invention.

As can be seen from FIG. 5B, there is a correlation between the saturation voltage Vt, sat and the turn-off current Id, off, and the S/D proximity. Specifically, S/D proximity increasing means the distance between the source and the drain is increased, so that Id, off decreases, and Vt, sat decreases.

Figure 6A:
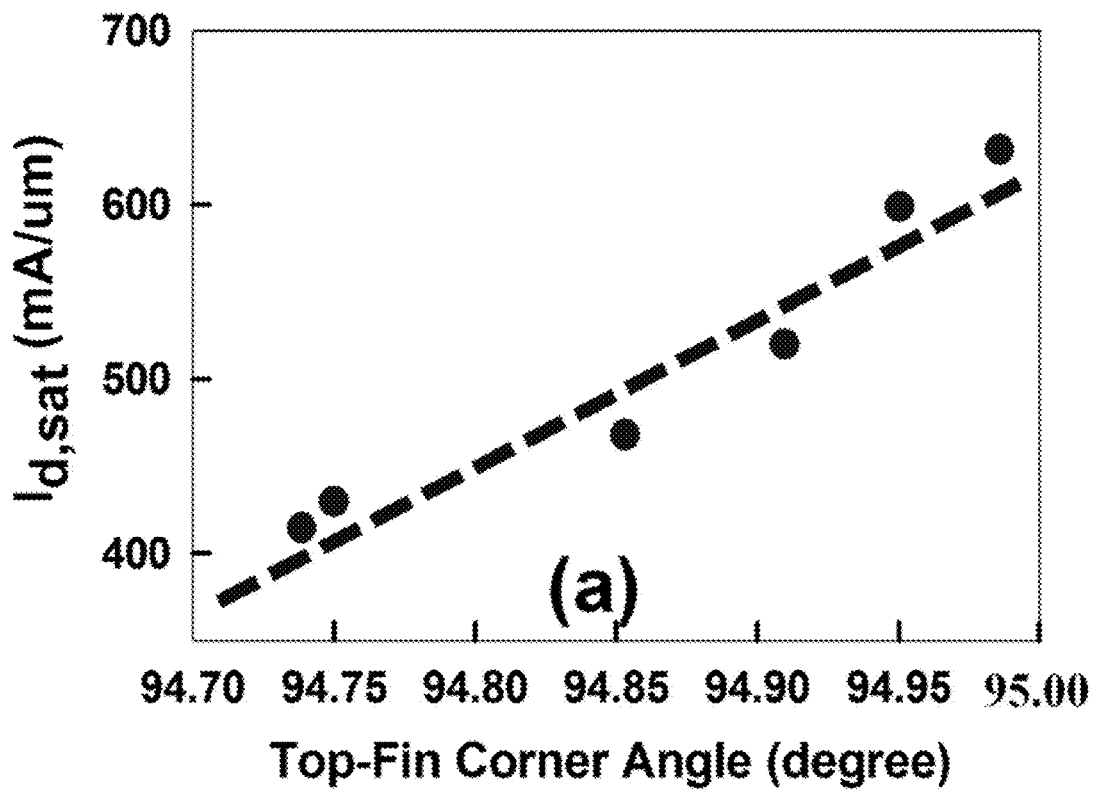
FIG. 6A verifies an aspect of the analysis results provided by the present invention.

As can be seen from FIG. 6A, there is a correlation between the saturation voltages Id, sat and the top-fin corner angle. Specifically, since the top fin corner angle increases, the effective gate width increases, thereby making the Id, Sat increase.

Figure 6B:
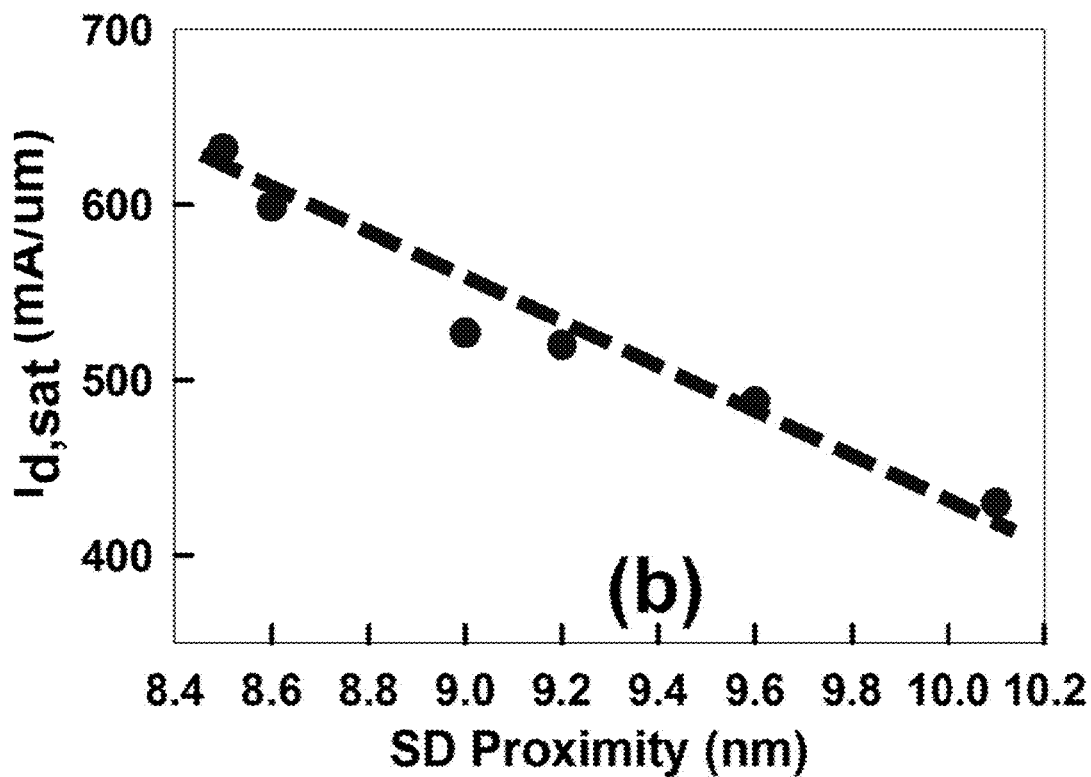
FIG. 6B verifies an aspect of the analysis results provided by the present invention.

As can be seen from FIG. 6B, there is a correlation between the saturation voltages $I_{d, sat}$ and the S/D proximity. Specifically, since the S/D proximity increases, the distance between the source and the drain becomes larger, so that $I_{d, off}$ decreases.

Therefore, according to the analysis method provided by the present invention, several key process parameters affecting electrical characteristics can be first found according to the electrical-process parameter model, and then the source process parameters are found according to the mutual influence relationship of the process parameters themselves, and formulas between the electrical parameters and the source process parameters (or other key process parameters) can be determined according to experience to determine how the electrical parameters interact with the source process parameters.

With above in mind, if the saturation current of the FinFET is found to be unsatisfactory, the source of the process parameters adjustment can be found according to the needs and the empirical formula obtained by the analysis method provided by the present invention, that is, the fin height, the top fin width, the bottom fin width, and the like can be selected and adjusted to accurately and efficiently optimize the saturation current in the desired direction.

For the specific calculation method, please refer to the above-mentioned part about the electrical-process parameter model processing method, and details are not described herein again.

Extracting a plurality of key electrical parameter models or key process parameter models further includes: extracting electrical parameter models or process parameter models whose absolute value of the correlation coefficient is greater than a preset threshold as key electrical parameter model or key process parameter model from the plurality of electrical parameter models or the plurality of process parameter models.

When there exist electrical parameter models or process parameter models whose absolute value of the correlation coefficient is greater than a preset threshold in the plurality of electrical parameter models or process parameter models, the electrical parameter models or the process parameter models are considered to be key electrical parameter models or key process parameter models, and the electrical parameters in the key electrical parameter models or the process parameter models in the key process parameter models are considered to be key electrical parameters or key process parameters, and then data mining is performed on key electrical parameter models or key process parameter models based on their correlation coefficients.

Data mining further includes: performing data mining based on correlation coefficients of a plurality of key electrical parameter models or key process parameter models to determine correlations among the key electrical parameters or correlations among the key process parameters.

Data mining based on correlation coefficients of multiple key electrical parameter models or key process parameter models further includes establishing correlation coefficient matrix of multiple key electrical parameter models or multiple key process parameter models by using the correlation coefficients of multiple key electrical parameter models or multiple key process parameter models as matrix elements, and determining correlations among the key electrical parameters or correlations among the key process parameters based on the correlation coefficient matrix.

Determining correlations among the key electrical parameters or correlations among the key process parameters based on the correlation coefficient matrix further includes: performing condensed hierarchical clustering based on the correlation coefficient matrix.

In the above steps, the correlation coefficient matrix of the process parameter model is taken as an example to describe the construction method of the correlation coefficient matrix. Specifically, the construction of the correlation coefficient matrix of the process parameter model can refer to the following formula:

$$\rho_{IL} = \begin{bmatrix} \text{corr}(IL_1, IL_1) & \text{corr}(IL_1, IL_2) & \ldots & \text{corr}(IL_1, IL_{n-1}) & \text{corr}(IL_1, IL_n) \\ \text{corr}(IL_2, IL_1) & \text{corr}(IL_2, IL_2) & \ldots & \text{corr}(IL_2, IL_{n-1}) & \text{corr}(IL_2, IL_n) \\ \ldots & \ldots & \ldots & \ldots & \ldots \\ \text{corr}(IL_{n-1}, IL_1) & \text{corr}(IL_{n-1}, IL_2) & & \text{corr}(IL_{n-1}, IL_{n-1}) & \text{corr}(IL_{n-1}, IL_n) \\ \text{corr}(IL_n, IL_1) & \text{corr}(IL_n, IL_2) & & \text{corr}(IL_n, IL_{n-1}) & \text{corr}(IL_n, IL_n) \end{bmatrix}.$$

Specifically, the sensitivity analysis of the process parameter models or electrical parameter models further includes calculating a covariance of each process parameter model or electrical parameter model, and calculating a correlation coefficient of each process parameter model or electrical parameter model based on the covariance of each process parameter model or electrical parameter model.

Subsequently, Agglomerative Hierarchical Clustering (AHC) is performed based on the correlation coefficient matrix to determine the correlation between key process parameters or key electrical parameters.

Specifically, agglomerative hierarchical clustering is a bottom-up hierarchical clustering method that calculates the distance between classes based on a specified similarity or distance definition. The agglomerative hierarchical clustering method first treats each sample point as a single cluster, and then merges two clusters with the closest "distance" at each step (the distance here can be regarded as the definition of cluster proximity) until all the clusters are classified into the same class. Hierarchical clustering is often represented by a dendrogram (using "single-chain" clustering), from which the relationship between the cluster and its sub-clusters, and the order in which the clusters are merged and split are clearly visible. For 2D sample points, it can also be represented by a similar Nested Cluster Diagram.

Specifically, the basic agglomerative hierarchical clustering is the basis of the clustering hierarchical clustering algorithm family. The main idea is to start from the individual points as clusters and merge the two clusters with the closest "distance" until only one cluster remains. As follows:

Calculate the proximity matrix if needed;
Repeat:
  Merge the two closest clusters;
    Updating the proximity matrix to reflect the proximity between the new cluster and the original cluster;
  until: Only one cluster remains In the embodiment provided by the present invention, the proximity matrix may be the correlation coefficient matrix established above. Data mining based on agglomerative hierarchical clustering can group key process parameters or key electrical parameters and determine source process parameters or source electrical parameters, thereby providing the possibility to comprehensively analyze electrical parameters and process parameters.

According to the analysis method provided by the present invention, by performing comprehensive analysis of a plurality of process parameters for manufacturing HKMG fin field effect transistors and electrical parameters of the transistors, key process parameters affecting electrical parameters of the transistors are obtained, and process variation and its source that truly cause the electrical characteristics of transistors to change are excavated, thereby providing the possibility for subsequent adjustment of the process and optimization of the process.

The present invention also provides a computer device comprising a memory, a processor, and a computer program stored on the memory and operable on the processor, the processor executing the computer program to implement the steps of the above method.

The present invention also provides a computer readable storage medium having stored there on a computer program that, when executed by a processor, implements the steps of the above method.

The detailed description and technical effects of the computer device and the computer readable storage medium can be understood by referring to the embodiments of the semiconductor device analysis method described above, and details are not described herein again.

It will be further appreciated by a person skilled in the art that various illustrative logic blocks, modules, circuits, and algorithm steps described in conjunction with the embodiments disclosed herein can be implemented as electronic hardware, computer software, or a combination of both. In order to clearly illustrate the interchangeability between hardware and software, various illustrative components, frames, modules, circuits, and steps are generally described above in the form of functionalities thereof. Whether such functionalities are implemented as hardware or software is dependent on a specific application and design constrains imposed on the entire system. A person skilled could implement the described functionalities in different manners for each particular application, but this implementation decision should not be construed as resulting in departing from the scope of the present invention.

The various illustrative logic modules, and circuits described in connection with the embodiments disclosed herein may be general purpose processors, digital signal processors (DSPs), application specific integrated circuits (ASICs), field programmable gate arrays (FPGAs), or other programmable logic devices, discrete gate or transistor logic, discrete hardware components, or any combination thereof designed to perform the functions described herein are implemented or executed. A general purpose processor may be a microprocessor, but in the alternative, the processor may be any conventional processor, controller, micro-controller, or state machine. The processor may also be implemented as a combination of computing devices, such as a combination of a DSP and a microprocessor, a plurality of microprocessors, one or more microprocessors in conjunction with a DSP core, or any other such configuration.

The steps of a method or algorithm described in connection with the embodiments disclosed herein may be embodied in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor to enable the processor to read and write information to/from the storage medium. In the alternative, the storage medium can be integrated into the processor. The processor and the storage medium can reside in an ASIC. The ASIC can reside in the user terminal. In the alternative, the processor and the storage medium may reside as a discrete component in the user terminal.

In one or more exemplary embodiments, the described functions can be implemented in hardware, software, firmware or their any combination. If they are implemented as a computer program product in software, then various functions can be stored in a computer readable medium as one or more instructions or codes or transported via same. The computer readable medium comprises both a computer storage medium and a communication medium, and comprises any medium facilitating a computer program to transfer from one place to another. The storage medium can be any available medium that can be accessed by a computer. As an example but not limitation, such a computer readable medium can comprise RAM, ROM, EEPROM, CD-ROM or other optical disk storages, magnetic disk storages or other magnetic storage device, or any other medium that can be used for carrying or storing appropriate program codes in the form of instructions or data structures and can be accessed by a computer. Any connection is also rightly called a computer readable medium. For example, if the software is transported from a web site, a server, or other remote sources using a coaxial-cable, an optical fibre cable, a twisted pair, a digital subscriber line (DSL), or wireless techniques such as infrared, radio, and microwave or anything like that, then the coaxial-cable, the optical fibre cable, the twisted pair, the DSL, or the wireless techniques such as infrared, radio, microwave or anything like that are included in the definition of medium. Disks and discs as used herein comprise a compact disc (CD), a laser disc, an optical disc, a digital versatile disc (DVD), a floppy disk and a blue-ray disc, wherein the disks often reproduce data magnetically, and the discs optically reproduce data with laser. Combinations of the forgoing should also be included in the range of the computer readable medium.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

What is claimed is:

1. A manufacturing a FET (Field Effect Transistor), comprising:
    defining a plurality of process parameters for fabricating the FET;
    defining an electrical parameter of the FET, the electrical parameter being associated with the plurality of process parameters;
    obtaining a value of the electrical parameter via an online test during a fabrication process;
    performing key process parameter correlation analysis for each electrical parameter, wherein the key process parameter correlation analysis comprises: constructing a plurality of electrical-process models of an electrical parameter corresponding to each process parameter respectively;
    performing sensitivity analysis for each of the plurality of electrical-process models to obtain sensitivity analysis results;
    determining a plurality of key process parameters from the plurality of process parameters based on the obtained sensitivity analysis results of the plurality of electrical-process models, the plurality of key process parameters being associated with the electrical parameter;
    determining a relationship between the electrical parameter and the plurality of key process parameters based on a knowledge database at least by determining relationships among the plurality of process parameters; and
    adjusting the plurality of key process parameters during the fabrication process based at least on the relationship between the electrical parameter and the plurality of key process parameters.

2. The method of claim 1, wherein the relationship between the electrical parameter and the plurality of key process parameters comprises correlations and empirical formulas between the electrical parameter and the plurality of key process parameters.

3. The method of claim 1, wherein the knowledge database is pre-set with a plurality of association rules of electrical parameters and key process parameters, and is updated by self-learning of association rules.

4. The method of claim 1, wherein the sensitivity analysis for each of the plurality of electrical-process models further comprises:
    calculating a covariance of each of the plurality of electrical-process models; and
    calculating a correlation coefficient for each of the plurality of electrical-process models based on the covariance of the plurality of electrical-process models.

5. The method of claim 4, wherein determining a plurality of key process parameters for each electrical parameter further comprises:
    sorting correlation coefficients of a plurality of the plurality of electrical-process models by absolute values; and
    the plurality of key process parameters are process parameters corresponding to a predetermined number of plurality of electrical-process models having highest absolute values of the correlation coefficients.

6. The method of claim 1, wherein the key process parameter correlation analysis further comprises:
    obtaining a plurality of specific values for each of the process parameters; and obtaining a plurality of specific values for each of the electrical parameters.

7. The method of claim 1, wherein the analysis method further comprises:
    performing electrical parameter inline analysis on the plurality of electrical parameters, wherein the electrical parameter inline analysis comprises:
        constructing a plurality of electrical parameter models by grouping the plurality of electrical parameters in pairs;
    performing sensitivity analysis on each of the electrical parameter models;
    extracting a plurality of key electrical parameter models from the plurality of electrical parameter models based on sensitivity analysis results of the electrical parameter models; and
    performing data mining on the plurality of key electrical parameter models to determine correlations among a plurality of key electrical parameters of the plurality of electrical parameters.

8. The method of claim 7, wherein the plurality of key electrical parameters and correlations there between and correlations between each of the key electrical parameters and its corresponding key process parameters are analyzed to determine the relationship between the plurality of key electrical parameters and the plurality of key process parameters.

9. The method of claim 8, wherein the analysis method further comprises:
    adjusting the key process parameters according to required key electrical parameters based on the relationship between the plurality of key electrical parameters and the plurality of key process parameters.

10. The method of claim 7, wherein the sensitivity analysis of the plurality of electrical parameter models further comprises:
    calculating a covariance of each of the electrical parameter models; and
    calculating a correlation coefficient of each of the electrical parameter models based on the covariance of an electrical parameter model.

11. The method of claim 10, wherein extracting the plurality of key electrical parameter models further comprises:
    extracting an electrical parameter model whose absolute value of the correlation coefficient is greater than a preset threshold from the plurality of electrical parameter models as a key electrical parameter model.

12. The method of claim 10, wherein performing the data mining further comprises:
performing the data mining based on correlation coefficients of the plurality of key electrical parameter models to determine correlations among the key electrical parameters.

13. The method of claim 12, wherein performing the data mining based on correlation coefficients of the plurality of key electrical parameter models further comprises:
constructing a correlation coefficient matrix of the plurality of key electrical parameter models by using the correlation coefficients of the plurality of key electrical parameter models as matrix elements; and
determining the correlations among the key electrical parameters based on the correlation coefficient matrix.

14. The method of claim 13, wherein determining the correlations among the key electrical parameters based on the correlation coefficient matrix further comprises:
performing agglomerative hierarchical clustering based on the correlation coefficient matrix.

15. The method of claim 13, wherein the correlation coefficient is a Pearson correlation coefficient, and the correlation coefficient matrix is a Pearson correlation coefficient matrix.

16. The method of claim 1, further comprising:
constructing a plurality of process parameter models by grouping the plurality of process parameters in pairs;
performing sensitivity analysis on each of the process parameter models;
extracting a plurality of key process parameter models from the plurality of process models; and
determining correlations among the plurality of key process parameters.

17. A method for adjusting a manufacturing process of a FET (Field Effect Transistor) based on online testing, the method comprising: defining a plurality of process parameters for fabricating the FET; defining an electrical parameter of the FET, the electrical parameter being associated with the plurality of process parameters; obtaining a value of the electrical parameter via an online test during a fabrication process; calculating a correlation between the electrical parameter and each of the plurality of process parameters and determining relationships among the plurality of process parameters; determining a plurality of key process parameters affecting the electrical parameter, an absolute value of a correlation coefficient between the electrical parameter and each of the plurality of key process parameters being greater than a preset threshold; and adjusting the plurality of key process parameters during the fabrication process based at least on the correlation between the electrical parameter and each of the plurality of key process parameters.

18. The method of claim 17, wherein the electrical parameter comprises at least one of a turn-on voltage, a puncture voltage, a saturation current, a quiescent current, a turn-off current.

* * * * *